US009694451B1

United States Patent
Ross

(10) Patent No.: US 9,694,451 B1
(45) Date of Patent: Jul. 4, 2017

(54) HEAT SPREADING CHASSIS FOR RACK-MOUNTED COMPUTER SYSTEM

(71) Applicant: Amazon Technologies, Inc., Reno, NV (US)

(72) Inventor: Peter George Ross, Olympia, WA (US)

(73) Assignee: Amazon Technologies, Inc., Reno, NV (US)

( * ) Notice: Subject to any disclaimer, the term of this patent is extended or adjusted under 35 U.S.C. 154(b) by 340 days.

(21) Appl. No.: 13/887,576

(22) Filed: May 6, 2013

Related U.S. Application Data

(62) Division of application No. 12/717,282, filed on Mar. 4, 2010, now Pat. No. 8,451,600.

(51) Int. Cl.
*H05K 7/20* (2006.01)
*B23P 15/26* (2006.01)

(52) U.S. Cl.
CPC ............ *B23P 15/26* (2013.01); *H05K 7/2039* (2013.01); *H05K 7/20145* (2013.01); *H05K 7/20718* (2013.01)

(58) Field of Classification Search
CPC ........... H05K 7/20145; H05K 7/20154; H05K 7/20163; H05K 7/2039; H05K 7/20554; H05K 7/20563; H05K 7/20572; H05K 7/2059; H05K 7/20718; H05K 7/20727; H05K 7/20736; H05K 7/20745
USPC ...... 361/679.49–679.51, 695–697, 709–710, 361/711, 719; 454/184
See application file for complete search history.

(56) References Cited

U.S. PATENT DOCUMENTS

| | | | |
|---|---|---|---|
| 4,677,252 A | 6/1987 | Takahashi et al. | |
| 4,935,864 A * | 6/1990 | Schmidt et al. | 363/141 |
| 6,034,874 A | 3/2000 | Watanabe | |
| 6,064,567 A | 5/2000 | Cheng | |
| 6,259,605 B1 * | 7/2001 | Schmitt | G06F 1/183 361/724 |
| 6,288,896 B1 | 9/2001 | Hsu | |
| 6,590,768 B1 * | 7/2003 | Wiley | G06F 1/183 257/E23.099 |
| 6,621,693 B1 | 9/2003 | Potter et al. | |

(Continued)

FOREIGN PATENT DOCUMENTS

| DE | 102009054517 | 6/2011 |
|---|---|---|
| EP | 220275 | 6/2010 |
| KR | 2006021611 | 3/2006 |

OTHER PUBLICATIONS

Office Action from Canadian Application No. 2,585,200, Dated Aug. 26, 2015, Amazon Technologies, Inc., pp. 1-5.

(Continued)

*Primary Examiner* — Adam B Dravininkas
(74) *Attorney, Agent, or Firm* — Robert C. Kowert; Meyertons, Hood, Kivlin, Kowert & Goetzel, P.C.

(57) ABSTRACT

A computer system includes a circuit board assembly and a chassis. The circuit board assembly includes a circuit board and one or more heat producing components coupled to the circuit board. At least one of the heat producing components includes an exposed surface. The chassis includes one or more mounting portions that are coupled to the circuit board and support the circuit board. The chassis also includes one or more heat spreading portions. The heat spreading portions couple to exposed surfaces of one or more heat producing components on the circuit board.

20 Claims, 7 Drawing Sheets

(56) References Cited

U.S. PATENT DOCUMENTS

| | | | |
|---|---|---|---|
| 6,621,713 B2 | 9/2003 | Amaike et al. | |
| 6,809,932 B2 | 10/2004 | Wu | |
| 6,862,181 B1* | 3/2005 | Smith et al. | 361/690 |
| 6,977,815 B2 | 12/2005 | Hsu | |
| 7,082,034 B2* | 7/2006 | Tiwari | H01L 23/3675 |
| | | | 165/185 |
| 7,167,363 B1* | 1/2007 | Cushman et al. | 361/694 |
| 7,265,984 B2* | 9/2007 | Numata | H05K 7/2049 |
| | | | 165/104.33 |
| 7,957,140 B2 | 6/2011 | Mongia | |
| 2002/0008961 A1* | 1/2002 | Amaike | G06F 1/18 |
| | | | 361/679.48 |
| 2003/0155637 A1 | 8/2003 | Amura et al. | |
| 2005/0128713 A1* | 6/2005 | Schmidberger | 361/719 |
| 2005/0141209 A1 | 6/2005 | Chen | |
| 2005/0248922 A1* | 11/2005 | Chu | H05K 7/20809 |
| | | | 361/700 |
| 2005/0265004 A1* | 12/2005 | Coglitore | H05K 7/1488 |
| | | | 361/724 |
| 2006/0019597 A1* | 1/2006 | Beitelmal | H05K 7/20727 |
| | | | 454/184 |
| 2006/0061955 A1 | 3/2006 | Imblum | |
| 2006/0148398 A1* | 7/2006 | Ruch et al. | 454/184 |
| 2006/0187645 A1* | 8/2006 | Numata | 361/704 |
| 2006/0274496 A1 | 12/2006 | Lee et al. | |
| 2007/0076370 A1* | 4/2007 | Mongia et al. | 361/690 |
| 2007/0091566 A1* | 4/2007 | Sun | 361/695 |
| 2007/0253169 A1 | 11/2007 | Clawser | |
| 2008/0019102 A1 | 1/2008 | Yurko | |
| 2008/0191590 A1 | 8/2008 | Lin et al. | |
| 2008/0285224 A1* | 11/2008 | Odanaka et al. | 361/683 |
| 2010/0014247 A1* | 1/2010 | Wang et al. | 361/692 |
| 2010/0103633 A1 | 4/2010 | Fujimura et al. | |
| 2010/0271766 A1 | 10/2010 | Lin | |
| 2011/0058339 A1* | 3/2011 | Le | H05K 7/1421 |
| | | | 361/724 |
| 2011/0284422 A1 | 11/2011 | Yamada | |

OTHER PUBLICATIONS

Notification for the First Office Action for Chinese Application No. 201280061472.7, Dated Nov. 19, 2015, Amazon Technologies, Inc., pp. 1-18.

* cited by examiner

US 9,694,451 B1

HEAT SPREADING CHASSIS FOR RACK-MOUNTED COMPUTER SYSTEM

This application is a divisional of U.S. patent application Ser. No. 12/717,282, filed Mar. 4, 2010, which is incorporated by reference herein in its entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carried out an organization's operations. Typically, a computer room of a computing facility includes many server racks. Each server rack, in turn, includes many servers and associated computer equipment.

In many rack-mounted computer systems, circuit boards for the system are housed in a rack-mounted chassis. The chassis is commonly in the form of box having metal panels on the front, back, sides, bottom, and top (the top often in the form of a removable lid). Such a chassis may consume a significant amount of space in a rack. Moreover, such a chassis may add cost and complexity to the computer system.

Computer systems typically include a number of components that generate waste heat. Such components include processors, mass storage devices, and power supplies. For example, some computers with multiple processors may generate 250 watts of waste heat. Typically, each chassis in the rack has air vents in the front and rear panels. An external cooling system causes air to flow through the front vents, over heat producing component in the rack, and out through the back vents. In many cases, heat sinks, heat pipes or other components are required to achieve an adequate cooling of the heat producing components of a system. These components and the associated parts such as mounting brackets, spring clips, and fasteners, add cost and complexity to a system, over an above that of the chassis itself.

Figure 1:
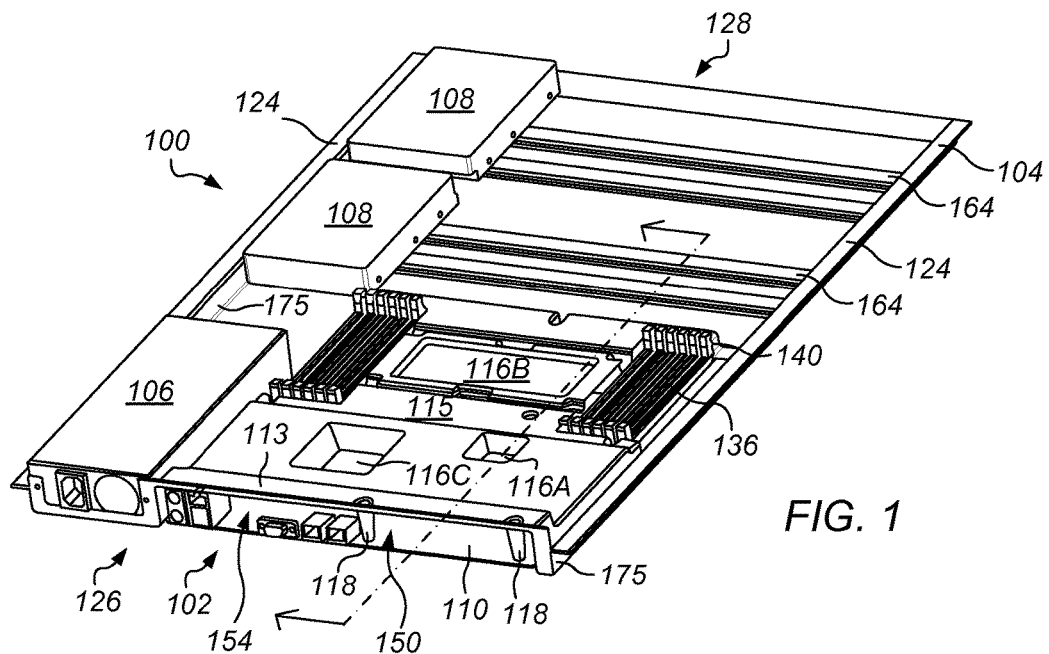
FIG. 1 illustrates an embodiment of a computer system including a circuit board assembly and a chassis with heat spreading portions.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a heat spreading chassis for a circuit board assembly, systems including such a chassis, and methods of producing and using such a chassis, are disclosed. According to one embodiment, a computer system includes a circuit board assembly and a chassis. The circuit board assembly includes a circuit board and one or more heat producing components. At least one of the heat producing components has an exposed surface. The chassis includes one or more mounting portions that are coupled to the circuit board and support the circuit board. The chassis also includes one or more heat spreading portions. The heat spreading portions couple to an exposed surface of one or more of the heat producing components on the circuit board, and transfer heat away from the heat producing components.

According to one embodiment, a system includes a rack and one or more computer systems mounted in the rack. At least one of the computer systems includes a circuit board assembly and a chassis. The circuit board assembly includes a circuit board and one or more heat producing components. At least one of the heat producing components includes an exposed surface. The chassis includes one or more mounting portions that are coupled to the circuit board and support the circuit board. The chassis also includes one or more heat spreading portions. The heat spreading portions couple to an exposed surface of one or more heat producing components on the circuit board.

According to one embodiment, a chassis for supporting, and transferring heat from, a circuit board assembly of a rack-mounted computer system includes one or more mounting portions and one or more heat spreading portions. At least one of the heat spreading portions couples to an exposed surface of one or more heat producing components of the circuit board assembly.

According to one embodiment, a method includes determining the locations of one or more exposed surfaces on heat producing components of a circuit board assembly. A chassis is produced that includes one or more heat spreading portions. The chassis may be contoured such that the heat spreading portions couple with the exposed surfaces of the heat producing components when the chassis is coupled to the circuit board assembly.

As used herein, "chassis" means a structure or element that supports another element or to which other elements can be mounted. A chassis may have any shape or construction, including a frame, a sheet, a plate, a box, a channel, or a combination thereof.

As used herein, "heat spreading", as applied to an element, a portion of an element, or a combination of elements, means that the element(s) or portion of the element can spread heat or transfer heat away from a heat producing component. One heat spreading portion of an element may overlap with other heat spreading portions of the element. For example, a heat spreading portion on a chassis for one component on a circuit board may overlap with another heat spreading portion on the chassis for another heat producing component on the circuit board. A heat spreading portion may be any shape, including flat, curved, concave, irregular, or a combination thereof.

As used herein, "mounting portion" includes a portion of an element to which another element can be mounted or coupled. For example, a mounting portion of a chassis may include a standoff that maintains a fixed spacing between a circuit board and a main panel of the chassis. A mounting portion may be integrally produced with other portions of an element (such as a standoff stamped from a panel in a sheet metal chassis) or it may be a separate part (such as a threaded post). In certain embodiments, a mounting portion may be a portion of a sheet metal panel with a hole to receive a fastener. In some embodiments, an interposing member, such as a spacer or a washer, may be included between the mounting portion and the mounted element.

As used herein, a "rack" means a rack, container, frame, or other element or combination of elements that can contain or physically support one or more computer systems.

As used herein, a "boss" means any element or portion of an element that can couple to an external surface of a component or a circuit board. A boss may be any shape, including cup-shaped, concave, flat, curved, irregular, or a combination thereof. A boss may protrude toward the component to which it is to be coupled, or it may be flat or recessed relative to the component to which it is to be coupled. A boss can couple to an external surface directly, or indirectly (such as through an intermediate member or material such as a thermal interface pad or thermal grease.

As used herein, "contacting surface" means, in the context of a component, a surface that is in contact the structure or element to which it is mounted (a circuit board or socket, for example). For example, for a conventional socket-mounted semiconductor device, the contacting surface includes the bottom surface of the device.

As used herein, "exposed surface" means, in the context of a component, a surface of a component that is not a contacting surface. For example, for a conventional socket-mounted semiconductor device, the exposed surfaces include the top and left, right, front, and back sides of the device. As another example, for a cylindrically shaped device mounted on its bottom end, exposed surfaces include the top end and the cylindrical exterior wall of the device.

As used herein, "depression" means a portion or region of a structure that is lower than surrounding or adjacent portions of the structure. Examples of depressions include a pocket, a dimple, an indentation, a concavity, a groove, or a channel. In some embodiments, a depression in a sheet metal chassis is formed by stamping the depression in the sheet.

As used herein, "computing" includes any operations that can be performed by a computer, such as computation, data storage, data retrieval, or communications.

As used herein, "computer room" means a room of a building in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, a "space" means a space, area or volume.

Figure 2:
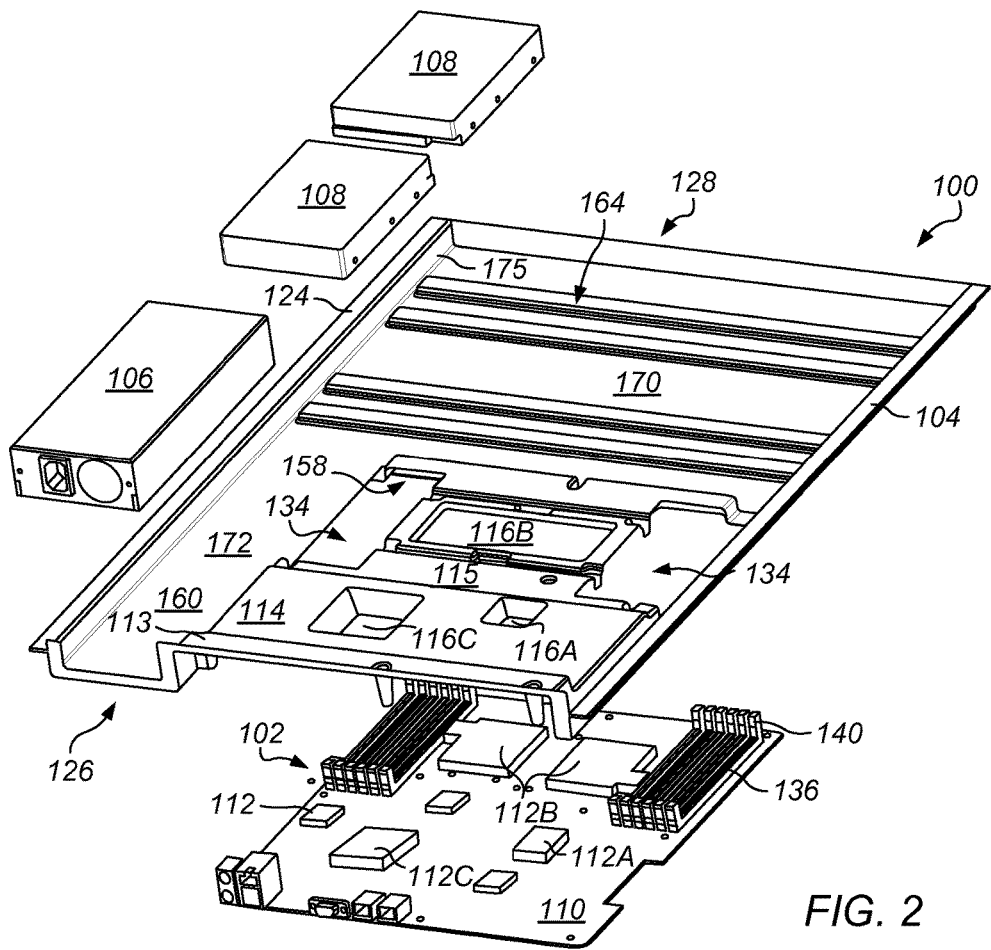
FIG. 2 is a partially exploded view of the computer system shown in FIG. 1, according to one embodiment.

In some embodiments, a computer system, such as a server, includes a chassis with heat spreading portions that couple to heat producing components on a circuit board. FIG. 1 illustrates an embodiment of a computer system including a circuit board assembly and a chassis with heat spreading bosses. FIG. 2 is a partially exploded view of the computer system shown in FIG. 1. Computer system 100 includes circuit board assembly 102, chassis 104, power supply 106, and hard disk drives 108. Circuit board assembly 102 is coupled to, and supported by, chassis 104. Power supply 106 and hard disk drives 108 are coupled on top of chassis 104.

Circuit board assembly 102 includes circuit board 110 and components 112. Components 112 are mounted on circuit board 110. Components 112 may include various heat producing components, such as semiconductor devices, resistors, or motors. Chassis 104 includes panels 113, 114, and 115 and heat spreading bosses 116. Panel 113 is coupled to board 110 by way of standoffs 118. Standoffs 118 maintain panel 113 and board 110 at a fixed spacing from one another.

Each heat spreading boss 116 may protrude downwardly from a portion of the chassis. For example, heat spreading boss 116A protrudes downwardly from panel 114. Heat spreading boss 116B protrudes downwardly from panel 115. In one embodiment, chassis 104 is formed from a metal sheet, and heat spreading bosses 116 are stamped in the metal sheet.

Heat spreading boss 116A may be dimensioned to couple with heat producing component 112A. Heat spreading boss 116B may be dimensioned to couple with heat producing component 112B. Heat spreading boss 116C may be dimensioned to couple with heat producing component 112C. Components 112B may be, for example, central processing units for a computer system 100. Components 112A and 112C may be, for example, I/O components for computer system 100. In some embodiments, one or more heat spreading bosses may not couple to a specific component on a circuit board. For example, a heat spreader boss may couple directly to a circuit board. In certain embodiments, a boss may not couple to any other element.

Computer system 100 may be rack-mountable. For example, rails 124 on the left and right sides of chassis 104 may engage on corresponding rails, slides, or ledges, on left and right sides of a rack. In certain embodiments, a rail kit may be installed on the sides of a chassis. A cooling air system for the rack may pass air over, under, or through computer system 100. In one embodiment, air flows from front 126 of computer system 100 to back 128 of computer system 100.

In some embodiments, a chassis includes cutouts, holes, apertures, or other openings to allow space for, or access to, components and assemblies mounted on a circuit board, and/or to accommodate cable runs. For example, chassis 104 includes cutouts 134. Cutouts 134 allow access to dual in-line memory module (DIMM) slots 136 on circuit board 110. Cutouts 134 allow a user to install DIMMs (not shown for clarity) in slots 136 and to operate DIMM levers 140 to remove DIMMS from slots 136.

In some embodiments, a chassis is coupled to a circuit board such that air gaps exist between the portions of the chassis and the circuit board. In computer system 100 shown in FIG. 1, for example, panels 113, 114, and 115 are spaced away from the top surface of circuit board 110. Thus, a gap exists between circuit board 110 and each of the panels. Gaps may be, in some embodiments, between about 5 millimeters and about 20 millimeters. Gaps between may form a passage 150 between panels 113, 114, and 115, on the one hand, and circuit board 104, on the other. The cross section of a passage may be constant or vary over the length of a passage. For example, as shown in FIG. 1, passage 150 necks down to a smaller height between panel 113 and 114, and then necks down again between panel 114 and 115. In some embodiments, the shape of a passage may be controlled with surfaces of a chassis so as to increase or decrease the velocity of air flowing through selected areas of a passage. For example, the velocity of air in passage 150 may increase as it passes from the space below panel 113 to the narrower space below panel 114.

Air passage 150 may be in fluid communication with one or both of cutouts 134. Thus, air may flow in inlet 154, pass through passage 150, and exit through cutouts 134. In some embodiments, covers or plates may be provided in or near apertures to passage 150, such as inlet 154 or cutouts 134. For example, a faceplate may be provided for inlet 154 having vents to allow air flow and apertures for I/O connectors on circuit board 110. Such covers or plates may providing EMI shielding for plates, regulate flow various regions of passage 150, or both.

As air passes through passage 150, the air may flow over exposed components 112 and remove heat from the components. The air exiting passage 150 may continue to flow back toward the rear of computer system 100. Some of the air may pass through DIMMs installed DIMM slots 136. After passing over DIMM slots 136, air may pass through rear slots 158 (shown in FIG. 2) between panel 115 and panel 162.

Power supply 106 is mounted in seat 160 of chassis 104. Power supply 106 may supply power to circuit board assembly 102. In certain embodiments, circuit board assembly 102 may receive power from a power supply external to computer system 100 (such as a rack-level power supply), and power supply 160 may be omitted.

Hard disk drives 108 may be mounted on rails 164 of chassis 104. Rails 164 may provide stiffness to chassis 104 to support the weight of hard disk drives 108. In some embodiments, chassis 104 is formed from sheet metal, and rails 164 are stamped in the sheet.

Figure 3:
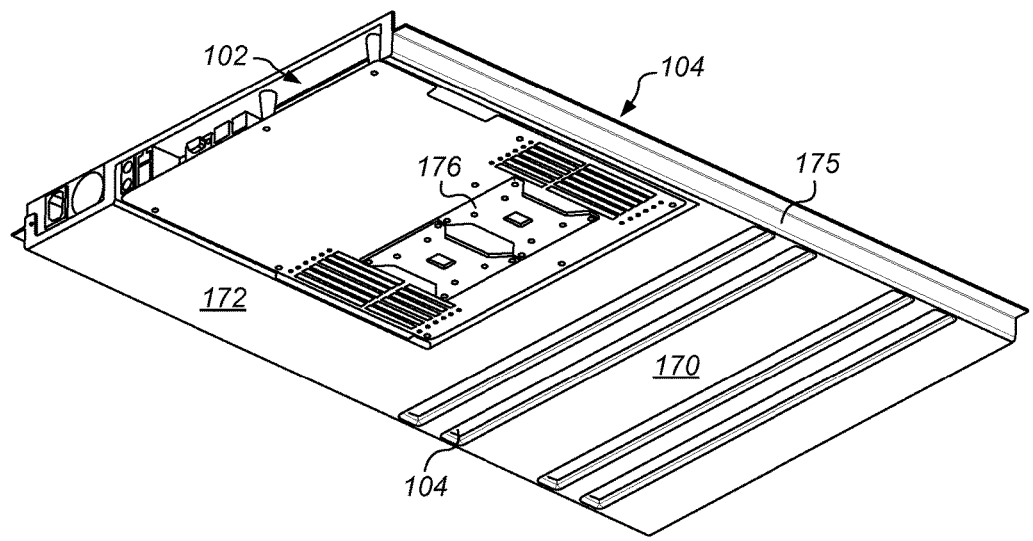
FIG. 3 illustrates a bottom perspective view of the computer system shown in FIG. 1, according to one embodiment.

FIG. 3 illustrates a bottom perspective view of the computer system shown in FIG. 1. Rear base portion 170 of chassis 104 and front base portion 172 of chassis 104 may be in a common plane with one another. In addition, rear base portion 170 of chassis 104 and front base portion 172 of chassis 104 may be approximately the same height as circuit board 110 when circuit board 110 is coupled to chassis 104. Sides 175 may extend upwardly from the plane of front base portion 172 and rear base portion 170.

Circuit board 110 may be coupled to chassis 104 with any suitable fasteners, such as screws. Rails 164 may be provided (such as by stamping) in rear base portion 170 of chassis 104. Circuit board assembly 102 may include mounting plates 176. Mounting plates 176 may hold components 112B (shown in FIG. 1) on circuit board 104.

Figure 4:
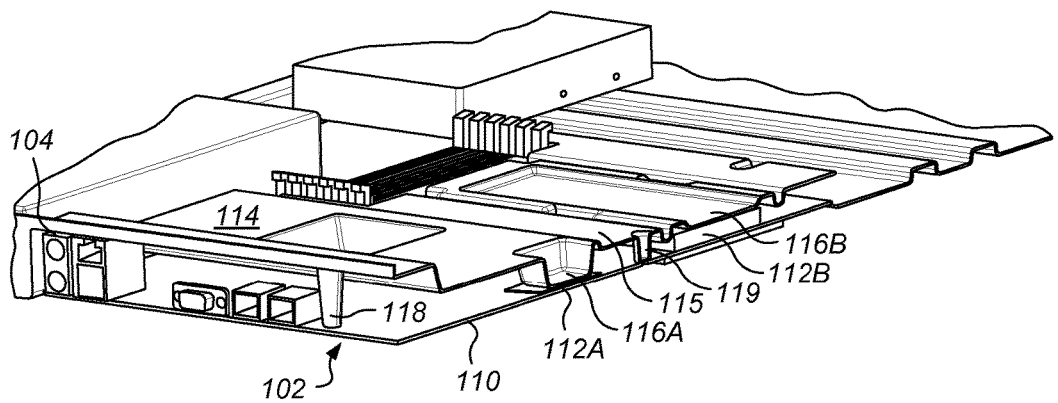
FIG. 4 illustrates a cutaway view of a computer system having a chassis with heat spreading portions, according to one embodiment.

FIG. 4 illustrates a cutaway view of computer system 100 shown in FIG. 1. The bottom portion of heat spreading boss 116A couples to the top of heat producing component 112A. The bottom portion of heat spreading boss 116B couples to the top of heat producing component 112B. In certain embodiments, a heat spreading portion of a chassis may couple to another exposed surface of a component. For example, a heat spreading portion may couple to a surface on the side of heat producing component. In one embodiment, heat producing component 112B is a central processing unit. Spacers 118 and 119 on chassis 104 maintain a predetermined spacing between circuit board 110 and chassis 104.

In some embodiments, a thermal grease, epoxy, or thermal interface material is provided between a heat spreading portion of a chassis and a heat producing component. In one embodiment, the thermal interface material is a resilient material, such as an elastomeric thermal pad. In another embodiment, the thermal interface material is a phase change material.

Figure 5:
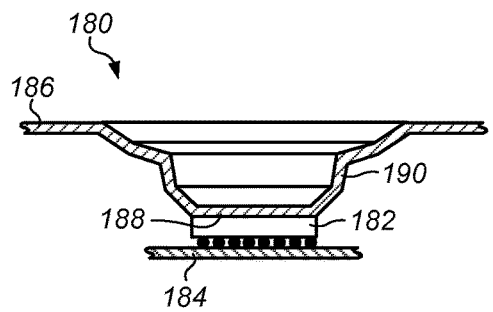
FIG. 5 illustrates a heat spreading portion of a chassis in which the heat spreading portion has a bellows-type construction, according to one embodiment.

In some embodiments, a spring element may be included to increase contact pressure at the interface between a heat producing component and a heat spreading portion of a chassis. In various embodiments, the spring element may be provided: between the heat producing component and the heat spreading portion, between the heat producing component and the circuit board, between the heat spreading portion of the chassis and the body of the chassis, or as part of the heat spreading portion. In certain embodiments, thermal bosses and/or panels of a chassis may be designed to deflect when the circuit board is coupled to a chassis. FIG. 5 illustrates a heat spreading portion of a chassis having a bellows-type construction. System 180 includes chassis 186 and circuit board 184. Chassis 186 may be coupled to and support circuit board 184. When chassis 186 is coupled to circuit board 184, the contacting surface of heat producing component 182 may deflect the bottom of heat spreading portion 188 upwardly to spring-load bellows 190. In reaction, the spring-loaded bellows may apply a downward force on heat producing component 182, thereby reducing thermal contact resistance at the junction between heat producing component 182 and heat spreading portion 188 of chassis 186. In certain embodiments, a chassis may be designed for an interference fit between heat producing components and heat spreading portions of a chassis.

Figure 6:
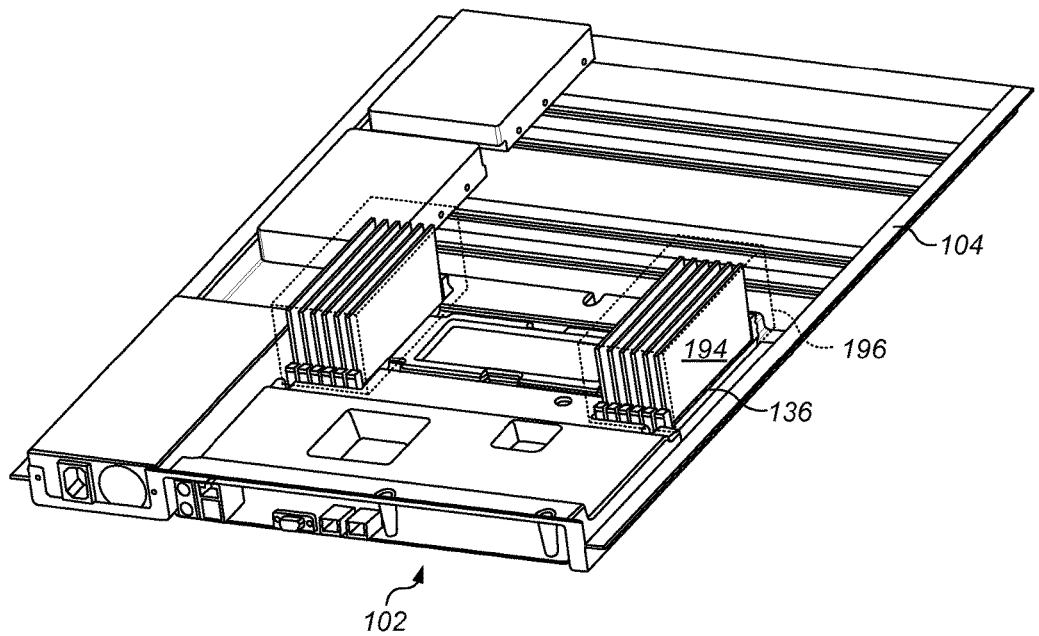
FIG. 6 illustrates a computer system having a circuit board assembly with memory modules that extend through cutouts in a heat spreading chassis, according to one embodiment.

FIG. 6 illustrates the computer system shown in FIG. 1 with DIMMs installed on the circuit board. One of DIMMs 194 is installed in each of DIMM slots 136. Covers 196 (shown in dashed lines for clarity) may be coupled to chassis 104. Covers 196 may be made of an electrically conductive material, such as aluminum. Covers 196, in combination with chassis 104, may form an EMI enclosure around DIMMs 194 and/or other active components of circuit board assembly 102.

Figure 7:
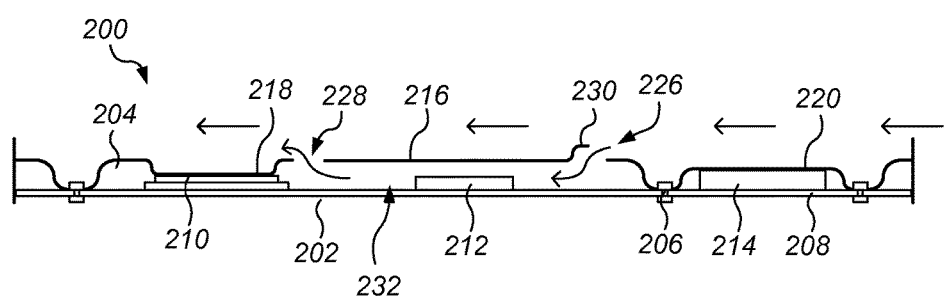
FIG. 7 is a cross sectional schematic illustrating an embodiment of a computer system having a heat spreading chassis.
Figure 8:
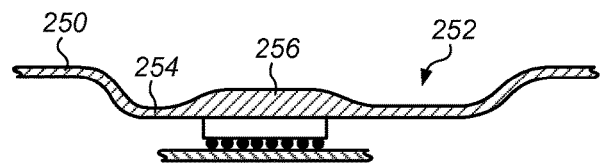
FIG. 8 illustrates a heat spreading portion of a chassis that has multiple thicknesses, according to one embodiment.

FIG. 7 is a cross sectional schematic illustrating another embodiment of a computer system having a heat spreading chassis. Computer system 200 includes circuit board assembly 202 and chassis 204. Circuit board assembly 202 is coupled to chassis 204 by way of fasteners 206. Circuit board assembly includes circuit board 208, components 210, 212, and 214. Chassis 204 is contoured to include body 216, heat spreading boss 218, and heat spreading boss 220. Body 216, heat spreading boss 218, and heat spreading boss 220 of chassis are spaced from circuit board 208. Heat spreading boss 218 may remove and spread heat from component 210. Heat spreading boss 220 may remove and spread heat from component 214.

Chassis 204 includes openings 226 and 228 and air-directing tab 230. Air may flow across chassis 204 in the direction of the arrows. Some of the air may flow over chassis 204 and cool chassis 204. Air directing tab 230 may direct some of the air flowing over chassis 204 into channel 232 between body 216 of chassis 204 and circuit board 208. Air flowing through channel 232 may cool components mounted on circuit board 208 having exposed surfaces in channel 232, such as component 212.

In various embodiments, heat spreading portions of a chassis may be sized and constructed to reduce spreading resistance and/or enhance cooling performance in a region of the chassis. Reduced spreading resistance may be desirable, for example, near a component or components having a relatively high power density, such as a central processing unit. FIG. 7 illustrates a heat spreading portion of a chassis that has multiple thicknesses. Panel 250 of chassis 252 includes main portion 254 and central portion 256. Central portion 256 is thicker than main portion 254, thereby reducing the spreading resistance of panel in the region of central portion 256.

Figure 9:
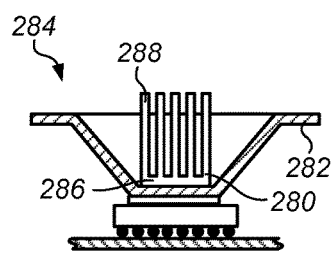
FIG. 9 illustrates a heat spreading portion of a chassis that includes a heat sink, according to one embodiment.

FIG. 9 illustrates a heat spreading portion of a chassis that includes a heat sink. Heat sink 280 is coupled to panel 282 of chassis 284. Heat sink 280 includes base 286 and fins 288. Heat sink 280 may be coupled to panel 282 by any manner of attachment, including soldering, brazing, rivets, adhesive, or screws. In certain embodiments, individual fins may be attached directly a panel of a chassis.

Figure 10:
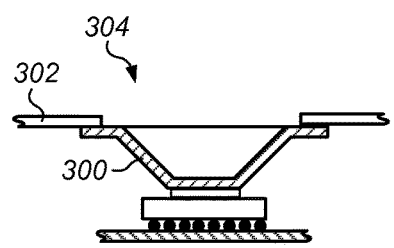
FIG. 10 illustrates a heat spreading portion of a chassis that includes a heat spreading insert, according to one embodiment.

In some embodiments, a chassis include more than one part. For example, a chassis may have two or more sections that are fastened to one another. In some embodiments, different parts of a chassis may be made of different materials. FIG. 10 illustrates a heat spreading portion of a chassis that includes a heat spreading insert. Heat spreading insert 300 may couple to panel 302 of chassis 304. Heat spreading insert 300 may be formed of material having higher thermal conductivity than panel 302. For example, panel 302 may be made of aluminum and heat spreading insert 300 may be made of copper. In certain embodiments, different parts of a chassis may be of different thicknesses. For example, a heat spreading insert may be thicker than a panel to which it is attached.

Figure 11:
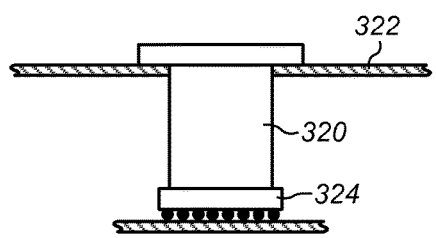
FIG. 11 illustrates a heat spreading portion of a chassis that includes a heat pipe, according to one embodiment.

FIG. 11 illustrates a heat spreading portion of a chassis that includes a heat pipe. Heat pipe 320 is coupled to panel 322. Heat pipe 320 may transfer heat from component 324 to panel 322. In certain embodiments, a heat pipe may be embedded in a chassis (between two sheets of metal brazed to one another at the edges, for example), rather than a separate, removable part.

Figure 12:
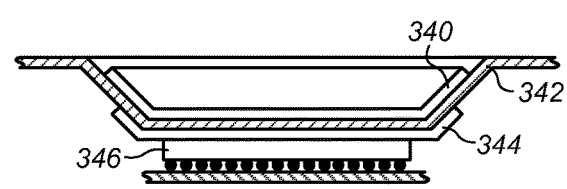
FIG. 12 illustrates a heat spreading portion of a chassis that includes upper and lower heat spreading elements, according to one embodiment.

FIG. 12 illustrates a heat spreading portion of a chassis that includes upper and lower heat spreading elements. Upper heat spreading element 340 is coupled on the top surface of boss 342. Lower heat spreading element 344 is coupled on the bottom surface of boss 342. Upper heat spreading element 340, lower heat spreading element 344, and boss 342 may transfer and spread heat away from heat producing component 346.

Figure 13:
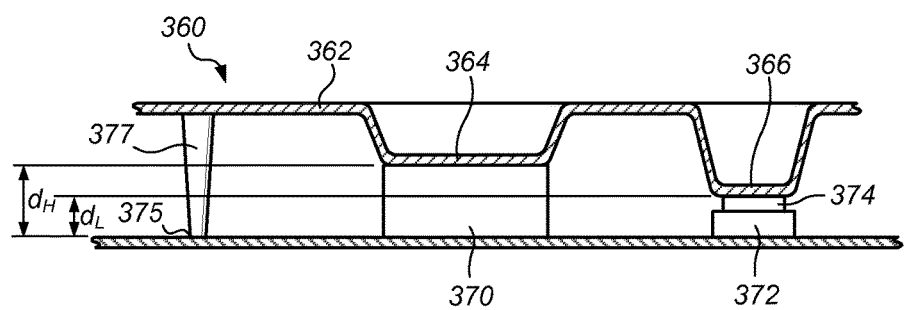
FIG. 13 illustrates a chassis including heat spreading portions for two heat producing components, according to one embodiment.

FIG. 13 illustrates a chassis including heat spreading portions for two heat producing components. Chassis 360 includes panel 362, heat spreading portion 364, heat spreading portion 366, and spacer 368. Heat spreading pad 364 is dimensioned to couple with high power density component 370. Heat spreading portion 366 is dimensioned to couple with low power density component 372. Thermal interface pad 374 is provided between heat spreading portion 366 and low power density component 372.

Figure 14:
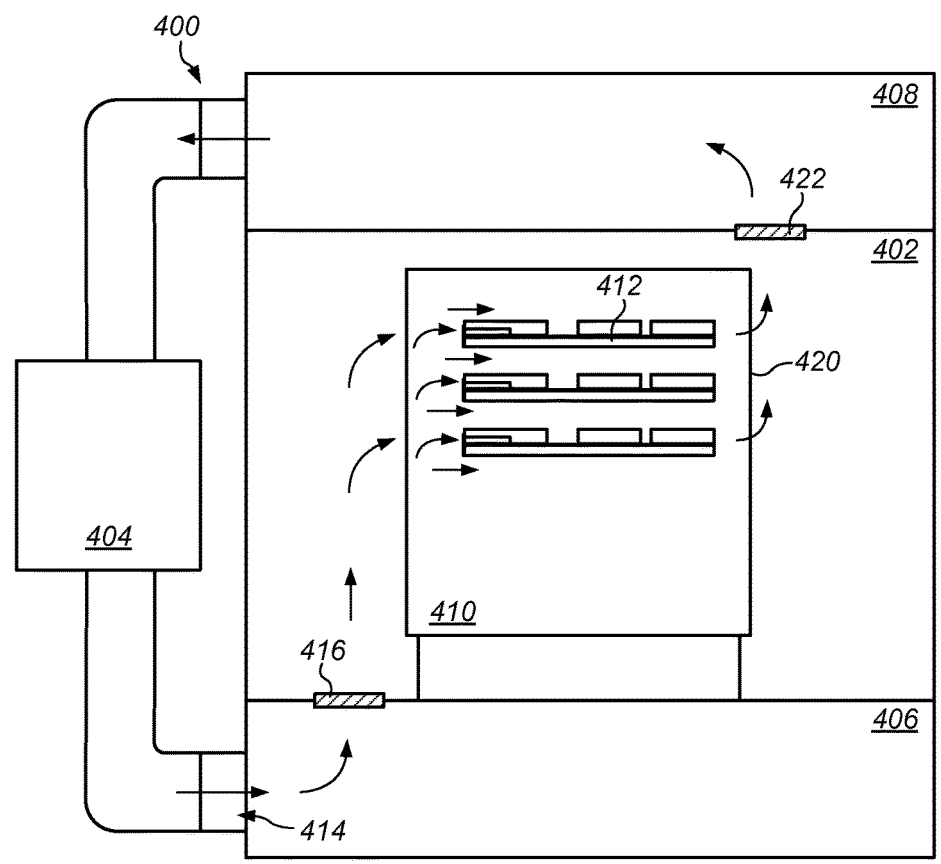
FIG. 14 is a schematic illustration of a data center including computer systems with heat spreading chassis, according to one embodiment.

In some embodiments, a data center includes one or more rack-mounted computer systems having heat spreading chassis. The rack-mounted computer systems may be commonly cooled by a cooling air system that delivers air to the rack. FIG. 14 is a schematic illustration of a data center including computer systems with heat spreading chassis according to one embodiment. Data center 400 includes computer room 402, air handling system 404, subfloor chamber 406, and plenum 408. Computer room 402 includes rack 410 and servers 412. To remove heat from servers 412 installed in rack 410, air handling system 404 may be operated to cause air to flow in computer room 402 and through rack system 410. Air may be forced into sub floor chamber 406 through opening 414. Air from subfloor chamber 406 may pass into computer room 402 through vent 416. Air from vent 416 may flow into rack system 410. Air may flow through computer systems 412. As indicated by the flow arrows, as the air reaches the front of each of servers 412, one portion of the air may pass over the chassis, another portion of the air may pass into a channel between the chassis and a circuit board, and a third portion may pass under the circuit board and the chassis of the server. After passing over servers 412, the heated air may exit rear 420 of rack system and flow out of computer room 402 through vent 422. In certain embodiments, servers 412 may have on board fans in addition to, or lieu of, a central cooling system. In certain embodiments, rack 410 may have a fan that supplies cooling air to all of servers 412 in the rack.

Figure 15:
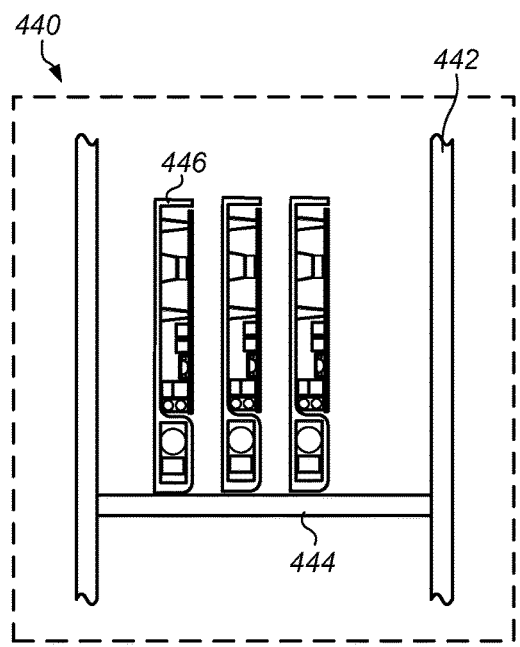
FIG. 15 illustrates a portion of a rack system including computer systems with heat spreading chassis in which the computer systems are arranged in a vertical orientation, according to one embodiment.

FIG. 15 illustrates a portion of a rack system including computer systems with heat spreading chassis in which the computer systems are arranged in a vertical orientation. System 440 includes rack 442, tray 444, and computer systems 446. Tray 444 is mounted in rack 442. Computer systems 446 a mounted vertically on tray 444. In some embodiments, air may be passed through rack 442 to cool computer systems 446. In certain embodiments, a computer system with a heat spreading chassis may be a blade server.

Figure 16:
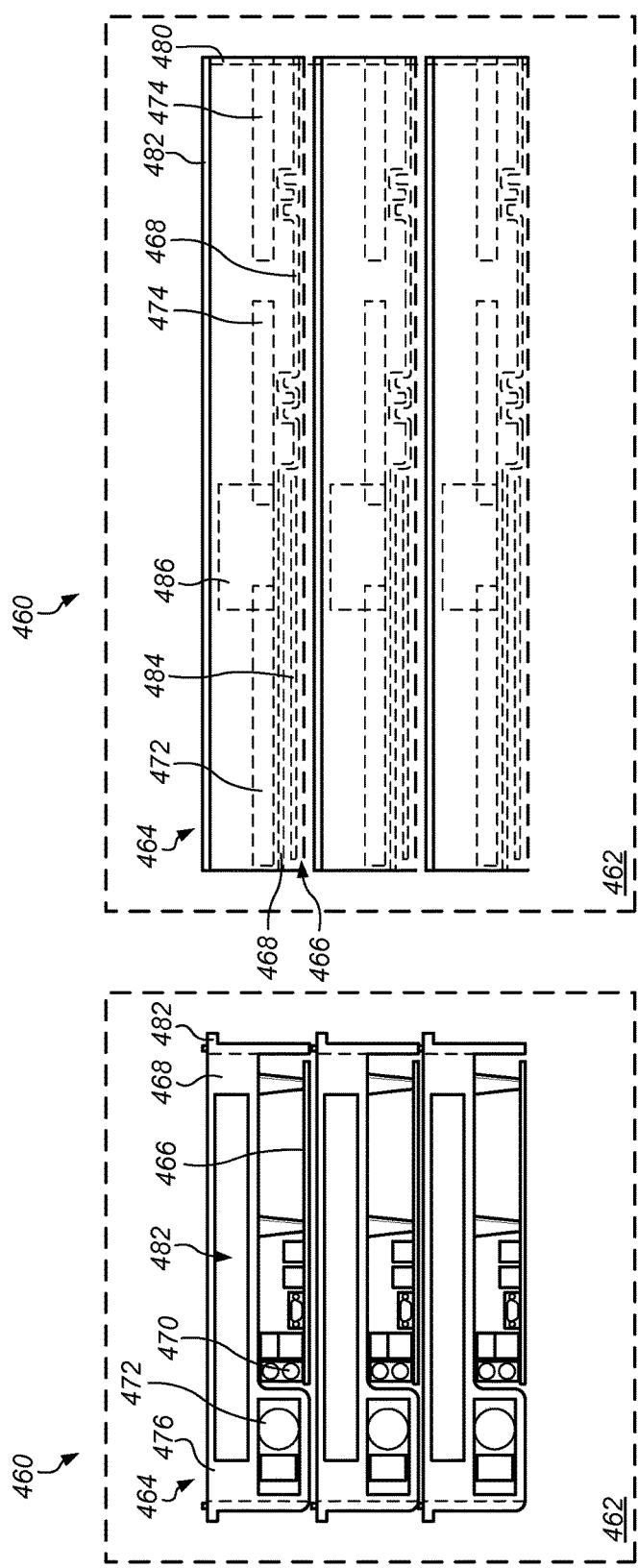
FIG. 16A illustrates a schematic end view of a system including heat spreading chassis forming EMI enclosures, according to one embodiment.
FIG. 16B illustrates a schematic side view of the system shown in FIG. 16A, according to one embodiment.

In some embodiments, portions of a heat spreading chassis may form part of an EMI enclosure for one or more circuit board assemblies of a computer system. FIG. 16A illustrates a schematic end view of a system including heat spreading chassis forming EMI enclosures according to one embodiment. FIG. 16B illustrates a schematic side view of the system shown in FIG. 16A. System 460 includes rack 462 and computer systems 464. Computer systems 464 include circuit board assembly 466, chassis 468, I/O connectors 470, power supply 472, and hard disk drives 474. Chassis 464 includes front panel 476, side panels 478, and rear panel 480. Front panel 476 includes upper air inlet 482. Circuit board assembly 466 may include circuit board 484 and DIMMs 486.

Front panel 476, side panels 478, rear panel 480 of each computer system 464 may extend upwardly to near the bottom of circuit board 484 and chassis 468 of the computer system immediately above it in rack 462. Front panel 476, side panels 478, rear panel 480, and portions of the chassis 468 may combine to form an EMI enclosure around components of circuit board assembly 466, such as DIMMs 486.

Figure 17:
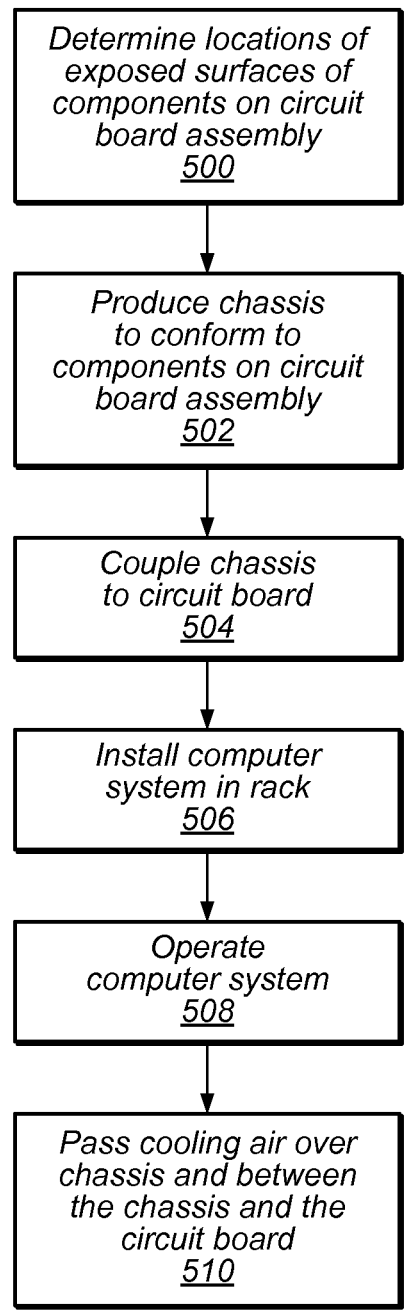
FIG. 17 illustrates one embodiment of producing a chassis with conforming heat spreading portions according to one embodiment.

FIG. 17 illustrates one embodiment of producing a chassis with conforming heat spreading portions according to one embodiment. At 500, for a particular configuration of a circuit board assembly (for example, the motherboard of a particular model of a server), the locations of exposed surfaces of heat producing components on a circuit board assembly may be determined. In some embodiments, a location for a surface of a component is a height of a surface of the component on the circuit board assembly. The locations may be relative to any suitable reference surface on the assembly. For example, the height of a component may be determined relative to a top surface of the circuit board to which the component is mounted. Locations of the exposed surfaces may be based on a designed dimensions (such as from production drawings and/or parts specifications), from actual measurements, or a combination thereof. In some embodiments, the circuit board assembly for which the exposed surfaces are determined is a part of an existing system. The existing system may include, for example, a box-style chassis and stand-alone heat sinks for various components on the circuit board.

At 502, a chassis may be produced that includes one or more heat spreading portions. The location, size, and shape of the heat spreading portions of a chassis may be based on the locations determined at 500 for the exposed surfaces of the heat producing components. The chassis may be produced such that the heat spreading portions conform to and/or correspond to selected exposed surfaces of heat producing components of the circuit board assembly. For example, for a particular model of a server, a chassis may be produced for the motherboard with a heat spreading boss that conforms to the top surface of a central processing unit on the motherboard. The formed heat spreading boss may contact the top surface of the central processing unit when the chassis is coupled to the motherboard.

In some embodiments, the chassis is formed from sheet metal. The thickness of the sheet may be, in one embodiment, between 1.5 and 2 millimeters. A heat spreading chassis may, however, be produced in various other manners, such as by casting, molding, or machining. The chassis may be produced as a single part (one piece of sheet metal, for example), or it may be an assembly of parts.

At 504, the chassis with heat spreading portions is coupled to a circuit board assembly having the configuration for which the chassis was produced. In some embodiments, the chassis with heat spreading portions may replace a chassis and one or more dedicated heat transfer components of an existing design (such as a design that includes a box-type chassis with stand-alone heat-sinks). In some embodiments, a heat spreading portion of a chassis may replace a particular heat sink of an existing design (such as a heat sink for a central processing unit). In certain embodiments, a chassis with heat spreading portions may eliminate the need for any dedicated heat-transfer components (such as component-mounted heat sinks) for a circuit board assembly.

Additional components, such as power supplies, hard disk drives, and cables, may be installed on the chassis with heat spreading portions. At 506, the circuit board assembly may be placed into a rack.

At 508, a computer system including the circuit board assembly and the chassis may be placed into operation. At 510, air may be passed over the computer system. In some embodiments, one portion of air is passed over the chassis, a second portion of air is passed between the portions of the chassis and the circuit board, and a third portion is passed below the circuit board and the chassis. In one embodiment, air is directed into a channel between the chassis and the circuit board through an opening in the chassis. In some embodiments, the velocity of air flowing through a channel may be controlled with the shape of a chassis. For example, surfaces of a chassis may direct air toward high power density components. Surfaces of a chassis may also be used to increase the velocity of air (such as by necking down a portion of a passage) or to increase the amount of air at a particular point or a region of the circuit board assembly. As described above with respect to 506, the computer system may, in some embodiments, be operated without any dedicated heat transfer components such as component-mounted heat sinks.

In some embodiments, the dimensions of one or more of the heat spreading portions may be produced to tighter tolerances than other heat spreading portions. For example, referring to FIG. 13, the tolerances on height $d_H$ between the contact surface 375 of mounting portion 377 and heat spreading boss 364 may be more tightly controlled than the tolerances on height $d_L$ between contact surface 375 of mounting portion 377 and heat spreading boss 366. The nominal dimensions $d_L$ and $d_H$ may be chosen such that good contact is assured between heat spreading boss 364 and high power density component 370. Producing a chassis in this manner may result in a gap between heat spreading boss 366 and low power density component 372 when chassis 362 is coupled to the circuit board. Resilient thermal interface pad 374 may, however, fill any such gap, and ensure effective heat transfer from low power density component 372 to chassis 362. In some embodiments, thermal grease or another thermal interface material may be included between heat spreading boss 364 and high power density component 370.

In some embodiments, a heat spreading chassis may include modular sections. Each section may include heat spreading portions for different components on one or more circuit board assemblies. In certain embodiments, heat spreading chassis sections may be standardized to be usable in two or more different circuit board assemblies. For example, if two or more models of a server include the same central processing unit but different I/O chipset, chassis for both models might both use the same heat spreading chassis section for the central processing unit portion of the servers, but different heat spreading chassis sections for the I/O portions of the servers.

Although the embodiments described above have been primarily in the context of rack-mounted systems, a heat spreading chassis with conforming heat spreading portions may, in other embodiments, be included in other systems, including stand-alone devices such as set top boxes, personal computing systems, and portable electronic devices. In certain embodiments, a single chassis may provide support for, two or more circuit board assemblies.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method, comprising:
 determining a location of one or more exposed surfaces on one or more heat producing components of a circuit board assembly;
 producing a chassis, wherein said producing comprises:
  including in the chassis, a pair of opposed left and right rails configured to mount on a corresponding pair of opposed left and right rails in a rack;
  including in the chassis one or more heat spreading portions, wherein the chassis is produced such that at least one of the heat spreading portions couples with at least one exposed surface of at least one of the heat producing components when the chassis is coupled to the circuit board; and
  arranging the chassis to horizontally mount in the rack and support the circuit board assembly in a horizontal orientation during operation of the circuit board assembly; and
 coupling the circuit board assembly to the chassis such that the left and right rails of the chassis extend beyond the circuit board assembly to enable the chassis to mount on the corresponding pair of opposed left and right rails in the rack, wherein the circuit board assembly is suspended horizontally from a bottom portion of the chassis such that the circuit board assembly is below the bottom portion of the chassis when the chassis is mounted in the rack.

2. The method of claim 1, wherein producing the chassis comprises forming the one or more heat spreading portions in a sheet of metal.

3. The method of claim 1, wherein producing the chassis comprises stamping at least one heat spreading boss in a sheet of metal.

4. The method of claim 1, wherein producing the chassis comprises forming two or more heat spreading portions in a sheet of metal, wherein a contact surface for at least one of the heat spreading portions is at a different height than a contact surface of at least one other of the heat spreading portions.

5. The method of claim 1, wherein the circuit board assembly for which the location of one or more exposed surfaces are determined is part of an existing computer system, wherein the method further comprises:
 coupling the circuit board assembly to the chassis such that at least one of the heat spreading portions of the chassis replaces at least one heat transfer component of the existing computer system.

6. The method of claim 1, wherein the formed chassis is configured to include at least one air channel between the circuit board assembly and the chassis when the chassis is coupled to the circuit board.

7. The method of claim 1, further comprising installing the circuit board assembly in the rack.

8. The method of claim 7, further comprising operating the circuit board assembly.

9. The method of claim 8, further comprising:
 flowing a first portion of air over the chassis; and
 flowing a second portion of air through at least one air passage between the chassis and the circuit board assembly.

10. The method of claim 9, wherein flowing the second portion of the air through at least one air passage between the chassis and the circuit board assembly comprises directing a portion of air flowing above at least a portion of the chassis into the passage.

11. The method of claim 9, wherein the chassis is coupled on one side of the circuit board assembly, the method further comprising flowing a third portion of air under the circuit board.

12. The method of claim 1, wherein producing the chassis comprises:
 producing a height of a first heat spreading portion of the chassis to within a first tolerance; and
 producing a height of a second heat spreading portion of the chassis to within a second tolerance, wherein the second tolerance is tighter than the first tolerance;
 wherein said coupling the circuit board assembly to the chassis comprises coupling the circuit board assembly to the chassis such that the first heat spreading portion couples with a first heat producing component on the circuit board assembly and such that the second heat spreading portion couples with a second heat producing component on the circuit board assembly, and wherein the first heat spreading portion is configured to transfer heat from the first heat producing component and the second heat spreading portion is configured to transfer heat from the second heat producing component.

13. The method of claim 12, further comprising providing a resilient element between the first heat spreading portion and the first heat producing component, wherein the resilient element is configured to resiliently fill a gap between the first heat spreading portion and the first heat producing component to reduce thermal resistance between the first heat spreading portion and the first heat producing component.

14. The method of claim 1, wherein:
 said coupling the circuit board assembly to the chassis comprises coupling the circuit board assembly to the chassis via one or more mounting portions, wherein the circuit board assembly is suspended in the horizontal orientation from the mounting portions such that the circuit board assembly is below a first heat spreading portion of the one or more heat spreading portions when the opposing left and right rails of the chassis are installed on corresponding left and right rails of the rack.

15. A method, comprising:
receiving a chassis comprising a pair of opposed left and right rails and one or more heat spreading portions; and
coupling the chassis with a circuit board such that at least one of the heat spreading portions couples with at least one exposed surface of at least one heat producing component of the circuit board when the chassis is coupled to the circuit board, wherein:
- the left and right rails of the chassis extend beyond the circuit board to enable the chassis to horizontally mount on a corresponding pair of opposed left and right rails of a rack; and
- the circuit board is suspended horizontally from a bottom portion of the chassis such that the circuit board is below the bottom portion of the chassis when the chassis is mounted in the rack.

16. The method of claim 15, wherein the chassis comprises:
- one or more upper portions, wherein at least one of the one or more upper portions is configured to be spaced away from the circuit board when the circuit board is coupled to the chassis; and
- one or more lower portions, wherein at least one of the one or more lower portions includes at least one of the one or more heat spreading portions.

17. The method of claim 16, wherein at least one of the one or more lower portions is a depression in the chassis.

18. A method, comprising:
producing a chassis, wherein said producing comprises:
- including a pair of opposed left and right rails configured to extend beyond a circuit board when the circuit board is coupled to the chassis and configured to mount on a corresponding pair of opposed left and right rails in a rack;
- including one or more upper portions configured to be spaced away from a circuit board when the circuit board is coupled to the chassis;
- including one or more lower portions comprising one or more heat spreading portions, wherein the chassis is produced such that at least one of the heat spreading portions is configured to couple with at least one exposed surface of at least one heat producing component of a circuit board when the circuit board is coupled to the chassis; and
arranging the chassis to horizontally mount in the rack and support the circuit board in a horizontal orientation during operation of the circuit board, wherein the circuit board is suspended horizontally from a bottom portion of the chassis such that the circuit board is below the bottom portion of the chassis when the chassis is mounted in the rack.

19. The method of claim 18, wherein at least one of the one or more upper portions and at least one of the heat spreading portions of the one or more lower portions are produced from a single piece of material.

20. The method of claim 18, wherein said producing the chassis further comprises:
- producing a height of first heat spreading portion of the chassis to within a first tolerance; and
- producing a height of second heat spreading portion of the chassis to within a second tolerance, wherein the second tolerance is tighter than the first tolerance.

\* \* \* \* \*